United States Patent
Fuse et al.

(10) Patent No.: US 11,879,067 B2
(45) Date of Patent: Jan. 23, 2024

(54) FILM FORMING METHOD AND FILM FORMING APPARATUS

(71) Applicants: Tokyo Electron Limited, Tokyo (JP); Daikin Industries, Ltd., Osaka (JP)

(72) Inventors: Takashi Fuse, Yamanashi (JP); Takashi Namikawa, Osaka (JP)

(73) Assignees: TOKYO ELECTRON LIMITED, Tokyo (JP); DAIKIN INDUSTRIES, LTD., Osaka (JP)

(*) Notice: Subject to any disclaimer, the term of this patent is extended or adjusted under 35 U.S.C. 154(b) by 0 days.

(21) Appl. No.: 17/288,130

(22) PCT Filed: Oct. 31, 2019

(86) PCT No.: PCT/JP2019/042929
§ 371 (c)(1),
(2) Date: Apr. 23, 2021

(87) PCT Pub. No.: WO2020/091016
PCT Pub. Date: May 7, 2020

(65) Prior Publication Data
US 2021/0380836 A1    Dec. 9, 2021

(30) Foreign Application Priority Data
Nov. 2, 2018 (JP) ................. 2018-207722

(51) Int. Cl.
*B05D 1/00*   (2006.01)
*C09D 171/00*   (2006.01)
*H01L 21/027*   (2006.01)

(52) U.S. Cl.
CPC ............. *C09D 171/00* (2013.01); *B05D 1/60* (2013.01); *H01L 21/0271* (2013.01)

(58) Field of Classification Search
CPC ...... C09D 171/00; B05D 1/60; H01L 21/0271
See application file for complete search history.

(56) References Cited

U.S. PATENT DOCUMENTS

2018/0053659 A1*   2/2018   Chakraborty ......... C23C 16/401
2018/0112079 A1*   4/2018   Itami ..................... C03C 17/42

FOREIGN PATENT DOCUMENTS

JP   2012-511635 A   5/2012

OTHER PUBLICATIONS

International Search Report and Written Opinion dated Jan. 28, 2020, received for PCT Application PCT/JP2019/042929, Filed on Oct. 31, 2019, 9 pages including English Translation.

* cited by examiner

*Primary Examiner* — Elizabeth A Burkhart
(74) *Attorney, Agent, or Firm* — XSENSUS LLP (57) ABSTRACT

A film forming method is a method of forming a film on a substrate top face including a first region in which a metal or a semiconductor is exposed and a second region in which an insulator is exposed. The method includes a SAM forming process of forming a self-assembled monolayer film of a perfluoropolyether group-containing compound on the first region and a film growth process of forming a predetermined film on the second region after execution of SAM forming process.

7 Claims, 6 Drawing Sheets

FILM FORMING METHOD AND FILM FORMING APPARATUS

CROSS-REFERENCE TO RELATED APPLICATIONS

The present application is based on PCT filing PCT/JP2019/042929, filed Oct. 31, 2019, which claims priority to JP 2018-207722, filed Nov. 2, 2018, the entire contents of each are incorporated herein by reference.

FIELD

The present disclosure relates to a film forming method and a film forming apparatus.

BACKGROUND

There have been techniques for forming a pattern on a substrate top face using a self-assembled monolayer (SAM) film in semiconductor processing and the like.

Patent Literature 1 discloses a method of patterning functionalizing molecules on a substrate top face by forming a SAM film of a perfluoropolyether organosulfur compound containing a functionalizing molecule on a substrate top face and etching an unfunctionalized region.

CITATION LIST

Patent Literature

Patent Literature 1: Japanese Patent Application Laid-open No. 2012-511635

SUMMARY

Technical Problem

The present disclosure provides a technique for selectively forming a film in accordance with a material of a substrate top face.

Solution to Problem

According to an aspect of an embodiment, a film forming method is a method of forming a film on a substrate top face including a first region in which a metal or semiconductor is exposed and a second region in which an insulator is exposed. The method includes a SAM forming process of forming a self-assembled monolayer film of a perfluoropolyether group-containing compound represented by formula (1) or (2) below on the first region and a film growth process of forming a predetermined film on the second region after execution of the SAM forming process. In formula (1), Rf is an alkyl group having 1 to 16 carbon atoms optionally substituted with one or more fluorine atoms. In formulae (1) and (2), PFPE is —$(OC_6F_{12})_a$—$(OC_5F_{10})_b$—$(OC_4F_8)_c$—$(OC_3F_6)_d$—$(OC_2F_4)_e$—$(OCF_2)_f$—, where a, b, c, d, e, and f are integers of 0 or more and 200 or less, and the sum of a, b, c, d, e, and f is at least 1. In formulae (1) and (2), A is —OH, —COOH, or —COOR, where R is an alkyl group having 1 to 4 carbon atoms. In formulae (1) and (2), X is a single bond or a di- to deca-valent organic group.

(1)

(2)

Advantageous Effects of Invention

The present disclosure can provide a technique for selectively forming a film in accordance with a material of a substrate top face.

DESCRIPTION OF EMBODIMENTS

Exemplary embodiments will be described below with reference to the drawings. In the present description and drawings, substantially the same configuration is denoted by the same reference sign and an overlapping description thereof is omitted.

[Flow of Film Forming Method]

A film forming method according to the present exemplary embodiment provides a technique for selectively forming a film in accordance with a material of a substrate top face when a film is formed on the substrate top face.

Figure 1:
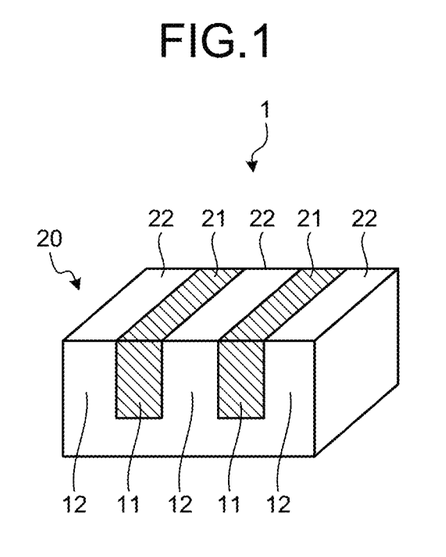
FIG. 1 is a diagram illustrating an exemplary configuration of a substrate according to exemplary embodiments.

FIG. 1 is a diagram illustrating an exemplary configuration of a substrate 1 according to the exemplary embodiments. The substrate 1 according to the present exemplary embodiment includes a metal pattern 11 formed of metal and an interlayer dielectric (ILD) 12 interposed between adjacent metal patterns 11. A substrate top face 20 has a metal region 21 (first region) in which a metal is exposed and an insulator region 22 (second region) in which an insulator is exposed. In the following, a method of selectively forming a predetermined film on the insulator region 22 will be described.

Figure 2:
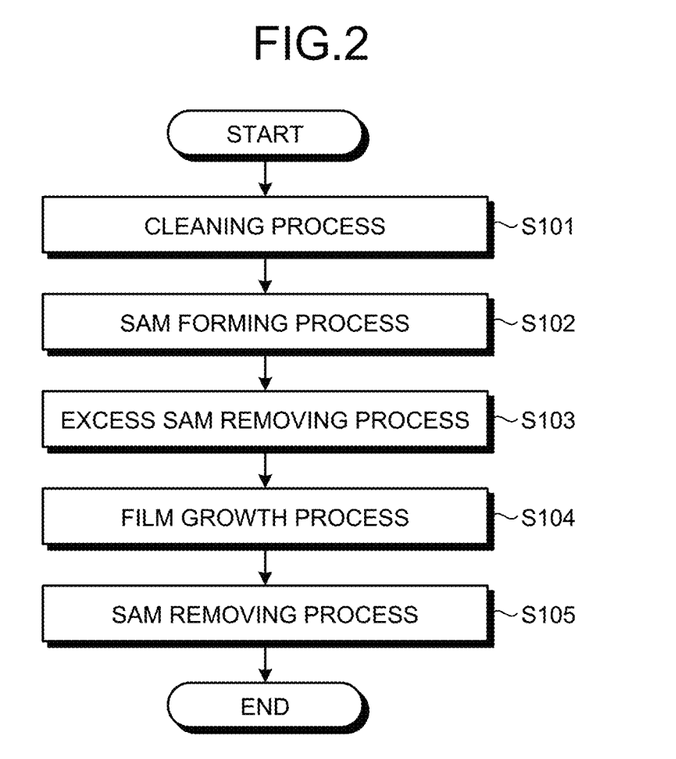
FIG. 2 is a flowchart illustrating an exemplary overall flow of a film forming method according to the exemplary embodiments.

FIG. 2 is a flowchart illustrating an exemplary overall flow of the film forming method according to the exemplary embodiments. The film forming method according to the present exemplary embodiment includes a cleaning process S101, a SAM forming process S102, an excess SAM removing process S103, a film growth process S104, and a SAM removing process S105.

The cleaning process S101 is a process of cleaning the substrate top face 20. The cleaning process S101 removes, for example, contamination adhering to the metal region 21 and the insulator region 22, metal oxides formed in the metal region 21, and the like. The cleaning process S101 may be omitted, for example, when the substrate top face 20 is substantially not contaminated.

The SAM forming process S102 is a process of forming a SAM film of a perfluoropolyether group-containing compound on the metal region 21 by supplying a perfluoropolyether group-containing compound represented by formula (1) or (2) below to the cleaned substrate top face 20.

$$(Rf\text{-}PFPE)_\alpha\text{-}X\text{-}(A)_\alpha \quad (1)$$

$$(A)_\alpha\text{-}X\text{-}PFPE\text{-}X\text{-}(A)_\alpha \quad (2)$$

In formula (1), Rf is independently an alkyl group having 1 to 16 carbon atoms optionally substituted with one or more fluorine atoms.

The "alkyl group having 1 to 16 carbon atoms" in the alkyl group having 1 to 16 carbon atoms optionally substituted with one or more fluorine atoms may be a straight chain or a branched chain. The carbon atom number of the straight chain or the branched chain of the "alkyl group having 1 to 16 carbon atoms" is preferably 1 to 6, and more preferably 1 to 3. Particularly preferably, the "alkyl group having 1 to 16 carbon atoms" is a linear alkyl group having 1 to 3 carbon atoms.

Preferably, Rf is an alkyl group having 1 to 16 carbon atoms substituted with one or more fluorine atoms. More preferably, Rf is a $CF_2H$—$C_{1-15}$ fluoroalkylene group or a perfluoroalkyl group having 1 to 16 carbon atoms. Particularly preferably, Rf is a perfluoroalkyl group having 1 to 16 carbon atoms.

The "perfluoroalkyl group having 1 to 16 carbon atoms" may be a straight chain or a branched chain. The carbon atom number of the straight chain or the branched chain of the "perfluoroalkyl group having 1 to 16 carbon atoms" is preferably 1 to 6, and more preferably 1 to 3. Particularly preferably, the "perfluoroalkyl group having 1 to 16 carbon atoms" is a linear perfluoroalkyl group having 1 to 3 carbon atoms. The "linear perfluoroalkyl group having 1 to 3 carbon atoms" is specifically —$CF_3$, —$CF_2CF_3$, or —$CF_2CF_2CF_3$.

In formulae (1) and (2), PFPE is independently —$(OC_6F_{12})_a$—$(OC_5F_{10})_b$—$(OC_4F_8)_c$—$(OC_3F_6)_d$—$(OC_2F_4)_e$—$(OCF_2)_f$—.

Here, a, b, c, d, e, and f are independently an integer of 0 or more and 200 or less, and the sum of a, b, c, d, e, and f is at least 1. Preferably, a, b, c, d, e, and f are independently an integer of 0 or more and 100 or less. The sum of a, b, c, d, e, and f is preferably 5 or more, and more preferably 10 or more. Specifically, the sum of a, b, c, d, e, and f may be 10 or more and 100 or less. The occurrence order of the repeating units in parentheses with a subscript a, b, c, d, e, or f is arbitrary.

These repeating units may be linear or branched, and preferably linear. For example, —$(OC_6F_{12})$— may be —$(OCF_2CF_2CF_2CF_2CF_2CF_2)$—, —$(OCF(CF_3)CF_2CF_2CF_2CF_2)$—, —$(OCF_2CF(CF_3)CF_2CF_2CF_2)$—, —$(OCF_2CF_2CF(CF_3)CF_2CF_2)$—, —$(OCF_2CF_2CF_2CF(CF_3) CF_2)$—, —$(OCF_2CF_2CF_2CF_2CF(CF_3))$—, or the like, but preferably —$(OCF_2CF_2CF_2CF_2CF_2CF_2)$—.

—$(OC_5F_{10})$— may be —$(OCF_2CF_2CF_2CF_2CF_2)$—, —$(OCF(CF_3)CF_2CF_2CF_2)$—, —$(OCF_2CF(CF_3) CF_2CF_2)$—, —$(OCF_2CF_2CF(CF_3)CF_2)$—, —$(OCF_2CF_2CF_2CF(CF_3))$—, or the like, but preferably —$(OCF_2CF_2CF_2CF_2CF_2)$—. —$(OC_4F_8)$— may be any of —$(OCF_2CF_2CF_2CF_2)$—, —$(OCF(CF_3)CF_2CF_2)$—, —$(OCF_2CF(CF_3)CF_2)$—, —$(OCF_2CF_2CF(CF_3))$—, —$(OC(CF_3)_2CF_2)$—, —$(OCF_2C(CF_3)_2)$—, —$(OCF(CF_3) CF(CF_3))$—, —$(OCF(C_2F_5) CF_2)$—, and —$(OCF_2CF (C_2F_5))$—, but preferably —$(OCF_2CF_2CF_2CF_2)$—. —$(OC_3F_6)$— may be any of —$(OCF_2CF_2CF_2)$—, —$(OCF (CF_3)CF_2)$—, and —$(OCF_2CF(CF_3))$— but preferably —$(OCF_2CF_2CF_2)$—. —$(OC_2F_4)$— may be any of —$(OCF_2CF_2)$— and —$(OCF(CF_3))$—, but preferably —$(OCF_2CF_2)$—.

In one aspect, PFPE is independently —$(OC_3F_6)_d$— (where d is an integer of 1 to 200, preferably 5 to 200, and more preferably 10 to 200). Preferably, PFPE is independently —$(OCF_2CF_2CF_2)_d$— (where d is an integer of 1 or more and 200 or less, preferably 5 or more and 200 or less, and more preferably 10 or more and 200 or less) or —$(OCF(CF_3)CF_2)_d$— (where d is an integer of 1 or more and 200 or less, preferably 5 or more and 200 or less, and more preferably 10 or more and 200 or less). More preferably, PEPE is independently —$(OCF_2CF_2CF_2)_d$— (where d is an integer of 1 or more and 200 or less, preferably 5 or more and 200 or less, and more preferably 10 or more and 200 or less).

In another aspect, PFPE is independently —$(OC_4F_8)_c$—$(OC_3F_6)_d$—$(OC_2F_4)_e$—$(OCF_2)_f$—. Here, c and d are independently an integer of 0 or more and 30 or less, e and f are independently an integer of 1 or more and 200 or less, preferably 5 or more and 200 or less, and more preferably 10 or more and 200 or less, and the occurrence order of the repeating units in parentheses with a subscript c, d, e, or f is arbitrary. Preferably, PFPE is independently —$(OCF_2CF_2CF_2CF_2)_c$—$(OCF_2CF_2CF_2)_d$—$(OCF_2CF_2)_e$—$(OCF_2)_f$—. In one aspect, PFPE may be independently —$(OC_2F_4)_e$—$(OCF_2)_f$—. Here, e and f are independently an integer of 1 or more and 200 or less, preferably 5 or more and 200 or less, and more preferably 10 or more and 200 or less, and the occurrence order of the repeating units in parentheses with a subscript e or f is arbitrary.

In yet another aspect, PFPE is independently a group represented by —$(R^6$—$R^7)_q$—. $R^6$ is $OCF_2$ or $OC_2F_4$, and preferably $OC_2F_4$. $R^7$ is a group selected from the group consisting of $OC_2F_4$, $OC_3F_6$, $OC_4F_8$, $OC_5F_{10}$, and $OC_6F_{12}$ or a combination of two or three groups independently selected from these groups. Preferably, $R^7$ is a group selected from the group consisting of $OC_2F_4$, $OC_3F_6$, and $OC_4F_8$ or a combination of two or three groups independently selected from these groups. Examples of the combination of two or three groups independently selected from the group consisting of $OC_2F_4$, $OC_3F_6$, and $OC_4F_8$ include, but not limited to, —$OC_2F_4OC_3F_6$—, —$OC_2F_4OC_4F_8$—, —$OC_3F_6OC_2F_4$—, —$OC_3F_6OC_3F_6$—, —$OC_3F_6OC_4F_8$—, —$OC_4F_8OC_4F_8$—, —$OC_4F_8OC_3F_6$—, —$OC_4F_8OC_2F_4$—, —$OC_2F_4OC_2F_4OC_3F_6$—, —$OC_2F_4OC_2F_4OC_4F_8$—, —$OC_2F_4OC_3F_6OC_2F_4$—, —$OC_2F_4OC_3F_6OC_3F_6$—, —$OC_2F_4OC_4F_8OC_2F_4$—, —$OC_3F_6OC_2F_4OC_2F_4$—, —$OC_3F_6OC_2F_4OC_3F_6$—, —$OC_3F_6OC_3F_6OC_2F_4$—, and —$OC_4F_8OC_2F_4OC_2F_4$—. Here, q is an integer of 2 to 100, and preferably an integer of 2 to 50. $OC_2F_4$, $OC_3F_6$, $OC_4F_8$, $OC_5F_{10}$, and $OC_6F_{12}$ may be either a straight chain or a branched chain, and preferably a straight chain. In this aspect, preferably, PFPE is independently —$(OC_2F_4$—$OC_3F_6)_q$— or —$(OC_2F_4$—$OC_4F_8)_q$—.

In formulae (1) and (2), A is independently at each occurrence —OH, —COOH, or —COOR. Here, R is a substituted or unsubstituted alkyl group having 1 to 4 carbon atoms. Examples of R include unsubstituted alkyl groups such as a methyl group, an ethyl group, a propyl group, an isopropyl group, a n-butyl group, and an isobutyl group, and substituted alkyl groups such as a chloromethyl group. Among these examples, alkyl groups, especially unsubstituted alkyl groups are preferable, and a methyl group or an ethyl group is more preferable.

In formulae (1) and (2), X is independently a single bond or a di- to deca-valent organic group. X is considered as a linker that connects a perfluoropolyether moiety (specifically, Rf-PFPE moiety or -PFPE-moiety) mainly providing hydrophobicity, surface slippage, and the like to a binding moiety (specifically, functional group A) providing an ability to bind to a substrate, in a compound represented by formula (1) or (2). X therefore may be any organic group as long as the compound represented by formula (1) or (2) can be present stably.

In formulae (1) and (2), $\alpha$ is an integer of 1 to 9, and $\alpha'$ is an integer of 1 to 9, where $\alpha$ and $\alpha'$ may vary with the valency of X. In formula (1), the sum of $\alpha$ and $\alpha'$ is equal to the valency of X. For example, when X is a decavalent organic group, the sum of $\alpha$ and $\alpha'$ is 10. For example, $\alpha$ may be 9 and $\alpha'$ may be 1, $\alpha$ may be 5 and $\alpha'$ may be 5, or $\alpha$ may be 1 and $\alpha'$ may be 9. When X is a divalent organic group, $\alpha$ and $\alpha'$ are 1. In formula (2), $\alpha$ is a value obtained by subtracting 1 from the valency of X.

X is preferably di- to hepta-valent, more preferably di- to tetra-valent, and more preferably a divalent organic group.

In one aspect, X is a di- to tetra-valent organic group, $\alpha$ is 1 to 3, and $\alpha'$ is 1.

In another aspect, X is a divalent organic group, $\alpha$ is 1, and $\alpha'$ is 1. In this case, formulae (1) and (2) are represented by formulae (3) and (4) below.

$$\text{Rf-PFPE-X-A} \tag{3}$$

$$\text{A-X-PFPE-X-A} \tag{4}$$

In a preferred aspect of formulae (3) and (4), X is independently, for example, but not limited to, a divalent group represented by formula (5) below.

$$-(R^{31})_{p1}-(Xa)_{q1}- \tag{5}$$

In formula (5), $R^{31}$ is a single bond, $-(CH_2)_{s'}-$, or an o-, m-, or p-phenylene group, and preferably $-(CH_2)_{s'}-$. Here, s' is an integer of 1 to 20, preferably an integer of 1 to 6, more preferably an integer of 1 to 3, and particularly preferably 1 or 2. $X^a$ is $-(X^b)_{t'}-$, where $X^b$ is independently at each occurrence a group selected from the group consisting of —O—, —S—, an o-, m-, or p-phenylene group, —C(O)O—, $-Si(R^{33})_2-$, $-(Si(R^{33})_2O)_{m''}-Si(R^{33})_2-$, $-CONR^{34}-$, $-O-CONR^{34}-$, $-NR^{34}-$, and $-(CH_2)_{n'}-$. $R^{33}$ is independently at each occurrence a phenyl group, a $C_{1-6}$ alkyl group, or a $C_{1-6}$ alkoxy group, preferably a phenyl group or a $C_{1-6}$ alkyl group, and more preferably a methyl group. $R^{34}$ is independently at each occurrence a hydrogen atom, a phenyl group, or a $C_{1-6}$ alkyl group (preferably, a methyl group). Here, m" is independently at each occurrence an integer of 1 to 100, and preferably an integer of 1 to 20, n' is independently at each occurrence an integer of 1 to 20, preferably an integer of 1 to 6, and more preferably an integer of 1 to 3, l' is an integer of 1 to 10, preferably an integer of 1 to 5, and more preferably an integer of 1 to 3, p1 is 0 or 1, and q1 is 0 or 1. At least one of p1 or q1 is 1, and the occurrence order of the repeating units in parentheses with a subscript p1 or q1 is arbitrary. $R^{31}$ and $X^a$ (typically, the hydrogen atom of $R^{31}$ and $X^a$) may be substituted with one or more substituents selected from the group consisting of a fluorine atom, a $C_{1-3}$ alkyl group, and a $C_{1-3}$ fluoroalkyl group.

Preferably, X is independently $-(R^{31})_{p1}-(X^a)_{q1}-R^{32}-$. $R^{32}$ is a single bond, $-(CH_2)_{t'}-$, or an o-, m-, or p-phenylene group, and preferably $-(CH_2)_{t'}-$, where t' is an integer of 1 to 20, preferably an integer of 2 to 6, and more preferably an integer of 2 to 3. $R^{32}$ (typically the hydrogen atom of $R^{32}$) may be substituted with one or more substituents selected from the group consisting of a fluorine atom, a $C_{1-3}$ alkyl group, and a $C_{1-3}$ fluoroalkyl group.

Preferably, X may be independently a $C_{1-20}$ alkylene group, $-R^{31}-X^c-R^{32}-$, or $-X^d-R^{32}-$. In these formulae, $R^{31}$ and $R^{32}$ are as defined above.

More preferably, X is independently a $C_{1-20}$ alkylene group, $-(CH_2)_{s'}-X^c-$, $-(CH_2)_{s'}-X^c-(CH_2)_{t'}-$, $-X^d-$, or $-X^d-(CH_2)_{t'}-$. In these formulae, s' and t' are as defined above.

$X^c$ is —O—, —S—, —C(O)O—, $-CONR^{34}-$, $-O-CONR^{34}-$, $-Si(R^{33})_2-$, $-(Si(R^{33})_2O)_{m''}-Si(R^{33})_2-$, $-O-(CH_2)_{u'}-(Si(R^{33})_2O)_{m''}-Si(R^{33})_2-$, $-O-(CH_2)_{u'}-Si(R^{33})_2-O-Si(R^{33})_2-CH_2CH_2-Si(R^{33})_2-O-Si(R^{33})_2-$, $-O-(CH_2)_{u'}-Si(OCH_3)_2OSi(OCH_3)_2-$, $-CONR^{34}-(CH_2)_{u'}-(Si(R^{33})_2O)_{m''}-Si(R^{33})_2-$, $-CONR^{34}-(CH_2)_{u'}-N(R^{34})-$, or $-CONR^{34}-$ (o-, m-, or p-phenylene)-$Si(R^{33})_2-$. Here, $R^{33}$, $R^{34}$, and m" are as defined above, and u' is an integer of 1 to 20, preferably an integer of 2 to 6, and more preferably an integer of 2 to 3. Preferably, $X^c$ is —O—.

$X^d$ is —S—, —C(O)O—, $-CONR^{34}-$, $-CONR^{34}-(CH_2)_{u'b}-(Si(R^{33})_2O)_{m''}-Si(R^{33})_2-$, $-CONR^{34}-(CH_2)_{u'}-N(R^{34})-$, or $-CONR^{34}-$ (o-, m-, or p-phenylene)-$Si(R^{33})_2-$. In these formulae, the symbols are as defined above.

More preferably, X may be independently a $C_{1-20}$ alkylene group, $-(CH_2)_{s'}-X^c-(CH_2)_{t'}-$, or $-X^d-(CH_2)_{t'}-$. In these formulae, the symbols are as defined above.

Particularly preferably, X is independently a $C_{1-20}$ alkylene group, $-(CH_2)_{s'}-O-(CH_2)_{t'}-$, $-(CH_2)_{s'}-(Si(R^{33})_2O)_{m''}-Si(R^{33})_2-(CH_2)_{t'}-$, $-(CH_2)_{s'}-O-(CH_2)_{u'}-(Si(R^{33})_2O)_{m''}-Si(R^{33})_2-(CH_2)_{t'}-$, or $-(CH_2)_{s'}-O-(CH_2)_{t'}-Si(R^{33})_2-(CH_2)_{u'}-Si(R^{33})_2-(C_vH_{2v})-$. $R^{33}$, m", s', t', and u' are as defined above, and v is an integer of 1 to 20, preferably an integer of 2 to 6, and more preferably an integer of 2 to 3.

$-(C_vH_{2v})-$ may be a straight chain or a branched chain and, for example, may be $-CH_2CH_2-$, $-CH_2CH_2CH_2-$, $-CH(CH_3)-$, or $-CH(CH_3)CH_2-$.

X may be independently substituted with one or more substituents selected from the group consisting of a fluorine atom, a $C_{1-3}$ alkyl group, and a $C_{1-3}$ fluoroalkyl group (preferably a $C_{1-3}$ perfluoroalkyl group).

In one aspect, X may be independently other than $-O-C_{1-6}$ alkylene group.

In another aspect, examples of X include groups represented by formulae (6) to (12) below.

(6)

In formulae (6) to (12), $R^{41}$ is independently a hydrogen atom, a phenyl group, an alkyl group having 1 to 6 carbon atoms, or a $C_{1-6}$ alkoxy group, and preferably a methyl group. D is a group selected from the group consisting of —$CH_2O(CH_2)_2$—, —$CH_2O(CH_2)_3$—, —$CF_2O(CH_2)_3$—, —$(CH_2)_2$—, —$(CH_2)_3$—, —$(CH_2)_4$—, —CONH—$(CH_2)_3$—, —$CON(CH_3)$—$(CH_2)_3$—, —CON(Ph)-$(CH_2)_3$— (where Ph is phenyl), and a group represented by formula (13) below.

In formula (13), $R^{42}$ is independently a hydrogen atom, a $C_{1-6}$ alkyl group, or a $C_{1-6}$ alkoxy group, preferably a methyl group or a methoxy group, and more preferably a methyl group.

In formulae (6) to (12), E is —$(CH_2)_n$— (where n is an integer of 2 to 6), D is bonded to PFPE of the molecular main chain, and E is bonded to a group opposite to PFPE.

Specific examples of X include:
—$CH_2O(CH_2)_2$—,
—$CH_2O(CH_2)_3$—,
—$CH_2O(CH_2)_6$—,
—$CH_2O(CH_2)_3Si(CH_3)_2OSi(CH_3)_2(CH_2)_2$—,
—$CH_2O(CH_2)_3Si(CH_3)_2OSi(CH_3)_2OSi(CH_3)_2(CH_2)_2$—,
—$CH_2O(CH_2)_3Si(CH_3)_2O(Si(CH_3)_2O)_2Si(CH_3)_2(CH_2)_2$—,
—$CH_2O(CH_2)_3Si(CH_3)_2O(Si(CH_3)_2O)_3Si(CH_3)_2(CH_2)_2$—,
—$CH_2O(CH_2)_3Si(CH_3)_2O(Si(CH_3)_2O)_{10}Si(CH_3)_2(CH_2)_2$—,
—$CH_2O(CH_2)_3Si(CH_3)_2O(Si(CH_3)_2O)_{20}Si(CH_3)_2(CH_2)_2$—,
—$CH_2OCF_2CHFOCF_2$—,
—$CH_2OCF_2CHFOCF_2CF_2$—,
—$CH_2OCF_2CHFOCF_2CF_2CF_2$—,
—$CH_2OCH_2CF_2CF_2OCF_2$—,
—$CH_2OCH_2CF_2CF_2OCF_2CF_2$—,
—$CH_2OCH_2CF_2CF_2OCF_2CF_2CF_2$—,
—$CH_2OCH_2CF_2CF_2OCF(CF_3) CF_2OCF_2$—,
—$CH_2OCH_2CF_2CF_2OCF(CF_3) CF_2OCF_2CF_2$—,
—$CH_2OCH_2CF_2CF_2OCF(CF_3) CF_2OCF_2CF_2CF_2$—,
—$CH_2OCH_2CHFCF_2OCF_2$—,
—$CH_2OCH_2CHFCF_2OCF_2CF_2$—,
—$CH_2OCH_2CHFCF_2OCF_2CF_2CF_2$—,
—$CH_2OCH_2CHFCF_2OCF(CF_3) CF_2OCF_2$—,
—$CH_2OCH_2CHFCF_2OCF(CF_3) CF_2OCF_2CF_2$—,
—$CH_2OCH_2CHFCF_2OCF(CF_3) CF_2OCF_2CF_2CF_2$—,
—$CH_2OCH_2$ $(CH_2)_7CH_2Si(OCH_3)_2OSi(OCH_3)_2(CH_2)_2Si(OCH_3)_2OSi(OCH_3)_2(CH_2)_2$—,
—$CH_2OCH_2CH_2CH_2Si(OCH_3)_2OSi(OCH_3)_2(CH_2)_3$—,
—$CH_2OCH_2CH_2CH_2Si(OCH_2CH_3)_2OSi(OCH_2CH_3)_2(CH_2)_3$—,
—$CH_2OCH_2CH_2CH_2Si(OCH_3)_2OSi(OCH_3)_2(CH_2)_2$—,
—$CH_2OCH_2CH_2CH_2Si(OCH_2CH_3)_2OSi(OCH_2CH_3)_2(CH_2)_2$—,
—$(CH_2)_2$—,
—$(CH_2)_3$—,
—$(CH_2)_4$—,
—$(CH_2)_5$—,
—$(CH_2)_6$—,
—CONH—$(CH_2)_3$—,
—$CON(CH_3)$—$(CH_2)_3$—,
—CON(Ph)-$(CH_2)_3$— (where Ph is phenyl),
—CONH—$(CH_2)_6$—,
—$CON(CH_3)$—$(CH_2)_6$—,
—CON(Ph)-$(CH_2)_6$— (where Ph is phenyl),
—CONH—$(CH_2)_2NH(CH_2)_3$—,
—CONH—$(CH_2)_6NH(CH_2)_3$—,
—$CH_2O$—CONH—$(CH_2)_3$—,
—$CH_2O$—CONH—$(CH_2)_6$—
—S—$(CH_2)_3$—,
—$(CH_2)_2S(CH_2)_3$—,
—CONH—$(CH_2)_3Si(CH_3)_2OSi(CH_3)_2(CH_2)_2$—,
—CONH—$(CH_2)_3Si(CH_3)_2OSi(CH_3)_2OSi(CH_3)_2(CH_2)_2$—,
—CONH—$(CH_2)_3Si(CH_3)_2O(Si(CH_3)_2O)_2Si(CH_3)_2(CH_2)_2$—,
—CONH—$(CH_2)_3Si(CH_3)_2O(Si(CH_3)_2O)_3Si(CH_3)_2(CH_2)_2$—,
—CONH—$(CH_2)_3Si(CH_3)_2O(Si(CH_3)_2O)_{10}Si(CH_3)_2(CH_2)_2$—,
—CONH—$(CH_2)_3Si(CH_3)_2O(Si(CH_3)_2O)_{20}Si(CH_3)_2(CH_2)_2$—,
—C(O)O—$(CH_2)_3$—,
—C(O)O—$(CH_2)_6$—,
—$CH_2$—O—$(CH_2)_3$—$Si(CH_3)_2$—$(CH_2)_2$—$Si(CH_3)_2$—$(CH_2)_2$—,
—$CH_2$—O—$(CH_2)_3$—$Si(CH_3)_2$—$(CH_2)_2$—$Si(CH_3)_2$—$CH(CH_3)$—,
—$CH_2$—O—$(CH_2)_3$—$Si(CH_3)_2$—$(CH_2)_2$—$Si(CH_3)_2$—$(CH_2)_3$—, —CH₂—O—(CH₂)₃—Si(CH₃)₂—(CH₂)₂—Si(CH₃)₂—CH(CH₃)—CH₂—,
—OCH₂—,
—O(CH₂)₃—,
—OCFHCF₂—,
a group represented by formula (14) below, and
a group represented by formula (15) below.

(14)

(15)

In yet another aspect, X is independently a group represented by formula (16) below.

(16)

In formula (16), x, y, and z are independently an integer of 0 to 10, the sum of x, y, and z is 1 or more, and the occurrence order of the repeating units in parentheses is arbitrary. $R^{16}$ is independently at each occurrence an oxygen atom, phenylene, carbazolylene, —$NR^{26}$— (where $R^{26}$ is a hydrogen atom or an organic group), or a divalent organic group, and preferably an oxygen atom or a divalent polar group.

Examples of the "divalent polar group" include, but not limited to, —C(O)—, —C(=$NR^{27}$)—, and —C(O) $NR^{27}$— (where $R^{27}$ is a hydrogen atom or a lower alkyl group). The "lower alkyl group" is, for example, an alkyl group having 1 to 6 carbon atoms (for example, methyl, ethyl, or n-propyl), which may be substituted with one or more fluorine atoms.

In formula (16), $R^{17}$ is independently at each occurrence a hydrogen atom, a fluorine atom, or a lower fluoroalkyl group, and preferably a fluorine atom. The carbon atom number of the "lower fluoroalkyl group" is, for example, 1 to 6. The "lower fluoroalkyl group" is preferably a fluoroalkyl group having 1 to 3 carbon atoms or a perfluoroalkyl group having 1 to 3 carbon atoms, more preferably a trifluoromethyl group or a pentafluoroethyl group, and particularly preferably a trifluoromethyl group.

In yet another aspect, examples of X include groups represented by formulae (17) to (24) below.

(17) (18)

(19) (20)

(21) (22)

(23)

(24)

In formulae (17) to (24), $R^{41}$ is independently a hydrogen atom, a phenyl group, an alkyl group having 1 to 6 carbon atoms, or a $C_{1-6}$ alkoxy group, and preferably a methyl group.

In each X, some of Ts are the following group bonded to PFPE of the molecular main chain.

—$CH_2O(CH_2)_2$—,
—$CH_2O(CH_2)_3$—,
—$CF_2O(CH_2)_3$—,
—$(CH_2)_2$—,
—$(CH_2)_3$—,
—$(CH_2)_4$—,
—$CONH$—$(CH_2)_3$—,
—$CON(CH_3)$—$(CH_2)_3$—,
—$CON(Ph)$-$(CH_2)_3$— (where Ph is phenyl), or
a group represented by formula (25) below.

(25)

In formula (25), $R^{42}$ is independently a hydrogen atom, a $C_{1-6}$ alkyl group, or a $C_{1-6}$ alkoxy group, preferably a methyl group or a methoxy group, and more preferably a methyl group.

Some of the other Ts are —$(CH_2)_{n''}$— (where n″ is an integer of 2 to 6) bonded to a group opposite to PFPE of the molecular main chain, and the other Ts, if any, are independently a methyl group, a phenyl group, a $C_{1-6}$ alkoxy group, a radical scavenger group, or an ultraviolet absorbing group.

The radical scavenger group is not limited as long as it can scavenge a radical produced in light radiation, and examples may include residues of benzophenones, benzotriazoles, benzoic esters, phenyl salicylates, crotonic acids, malonic esters, organoacrylates, hindered amines, hindered phenols, and triazines.

The ultraviolet absorbing group is not limited as long as it can absorb ultraviolet rays, and examples may include residues of benzotriazoles, hydroxybenzophenones, esters of substituted or unsubstituted benzoic acid or salicylic acid compounds, acrylates, alkoxycinnamates, oxamides, oxanilides, benzoxazinones, and benzoxazoles.

In a preferred aspect, preferred examples of the radical scavenger group or the ultraviolet absorbing group include groups represented by formulae (26) to (28) below.

(26)

(27)

(28)

In this aspect, X may be independently a tri- to deca-valent organic group.

The number average molecular weight of the perfluoropolyether group-containing compound (reactive perfluoropolyether group-containing silane compound) used in the present exemplary embodiment is 1,000 to 30,000, preferably 1,500 to 30,000, and more preferably 2,000 to 10,000.

The perfluoropolyether group-containing compound according to the present exemplary embodiment includes a perfluoropolyether moiety (a Rf-PFPE moiety or a -PFPE- moiety) mainly providing hydrophobicity, surface slippage, and the like, a binding moiety (functional group A) providing an ability to bind to a substrate, and a linker connecting the perfluoropolyether moiety to the binding moiety as described above. The binding force (affinity) of the binding moiety to a metal or semiconductor is greater than the binding force to an insulator. The perfluoropolyether group-containing compound therefore selectively binds to the metal region 21 and forms a SAM film.

The perfluoropolyether moiety has an action of blocking a substance that constitutes a film to be formed on the insulator region 22. The longer the linker is, the longer the distance is between the substrate top face 20 (metal region 21) to which the binding moiety binds and the perfluoropolyether moiety, and the greater the masking effect of the SAM film (the effect of suppressing formation of a film on the metal region 21) is.

Examples of a substance that constitutes the metal region 21 according to the present exemplary embodiment, that is, a metal or a semiconductor to which the perfluoropolyether group-containing compound easily binds include copper (Cu), tungsten (W), ruthenium (Ru), germanium (Ge), silicon (Si), titanium nitride (TiN), cobalt (Co), and molybdenum (Mo).

Examples of a substance that constitutes the insulator region 22, that is, an insulator to which the perfluoropolyether group-containing compound is less likely to bind include aluminum oxide (AlO), silicon nitride (SiN), silicon oxide ($SiO_2$), hafnium oxide ($HfO_2$), and zirconia ($ZrO_2$).

The excess SAM removing process S103 is a process of removing a SAM film (excess SAM film) formed on the insulator region 22 in execution of the SAM forming process S102. The perfluoropolyether group-containing compound has a stronger binding force to a metal or a semiconductor than to an insulator but may bind even to an insulator in some cases. The SAM film therefore may be slightly formed on the insulator region 22, in addition to the metal region 21, at the SAM forming process S102. In such a case, it is preferable that the perfluoropolyether group-containing compound (excess SAM film) adhering to the insulator region 22 is removed.

The method of removing the excess SAM film adhering to the insulator region 22 is not limited. For example, a method in which the SAM film formed on the substrate top face 20 may be thinned as a whole, a method in which the insulator region 22 is thinly stripped off together with the excess SAM film, or the like are available. An example of an agent that can be used when the excess SAM removing process S103 is executed is an aqueous solution of ammonium fluoride. When the excess SAM film is not formed on the insulator region 22 or is formed to a substantially insignificant degree, the excess SAM removing process S103 may be omitted.

The film growth process S104 is a process of forming a target film on the insulator region 22. At this process, the SAM film of the perfluoropolyether group-containing compound formed on the metal region 21 functions as a mask to enable the target film to be selectively grown on the insulator region 22.

Examples of a substance that constitutes a target film (predetermined film) to be grown on the insulator region 22 include $SiO_2$ and $Al_2O_3$.

The SAM removing process S105 is a process of removing the SAM film formed on the metal region 21 after execution of the film growth process S104. The method of removing the SAM film formed on the metal region 21 is not limited. For example, a method in which the SAM film on the metal region 21 may be directly removed by melting, etching, or the like, a method in which the metal region 21 may be thinly stripped off together with the SAM film, or the like are available. An example of an agent that can be used when the SAM removing process S105 is executed is hydrofluoroether.

Figure 3:
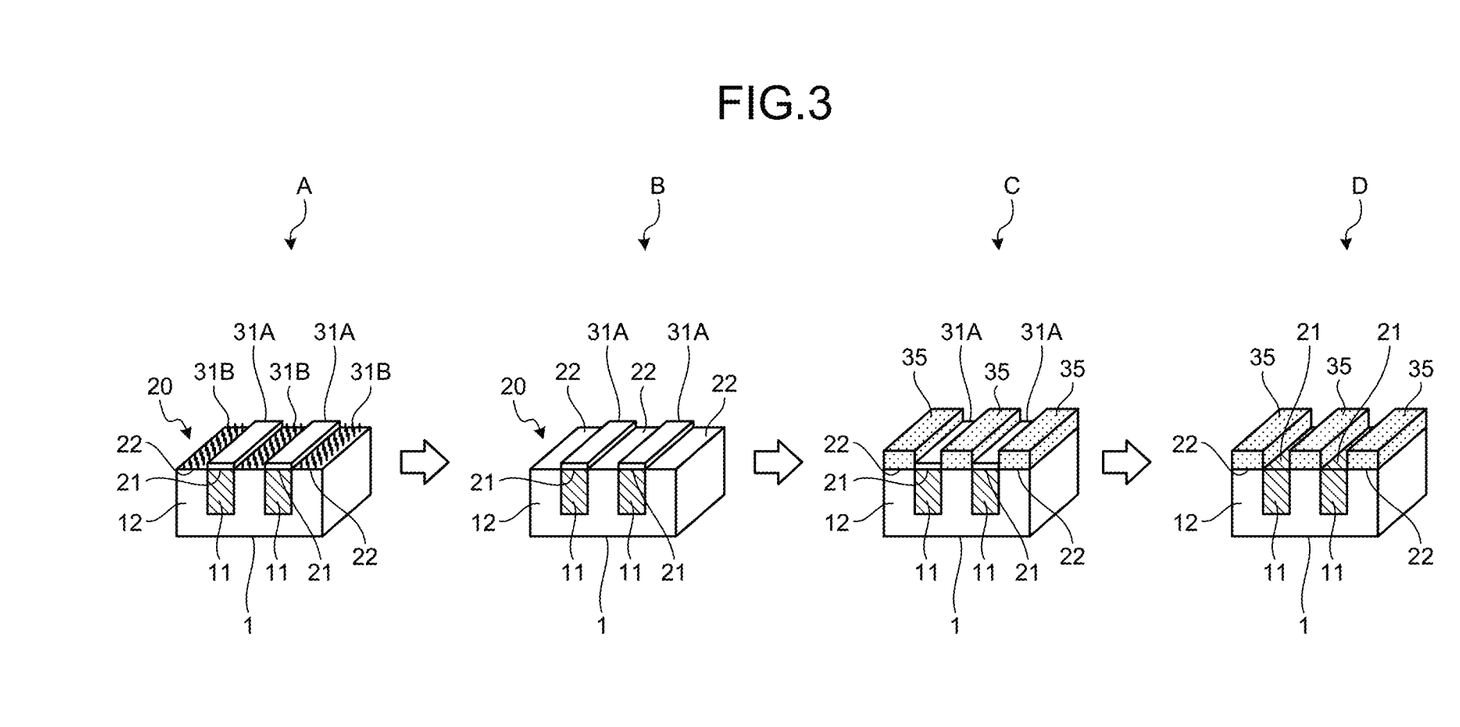
FIG. 3 is a diagram illustrating an exemplary state change of the substrate in execution of the film forming method according to the exemplary embodiments.

FIG. 3 is a diagram illustrating an exemplary state change of the substrate 1 in execution of the film forming method according to the exemplary embodiments. FIG. 3 illustrates states A to D.

The state A illustrates a state after the SAM forming process S102. At the SAM forming process S102, a SAM film 31A of the perfluoropolyether group-containing compound is formed on the metal region 21 of the substrate top face 20. Here, as illustrated in the state A, the perfluoropolyether group compound may slightly adhere even to the insulator region 22, and an excess SAM film 31B may be formed on the insulator region 22.

The state B illustrates a state after the excess SAM removing process S103. At the excess SAM removing process S103, the excess SAM film 31B on the insulator region 22 is removed, so that the SAM film 31A is present only on the metal region 21.

The state C illustrates a state after the film growth process S104. In execution of the film growth process S104, the SAM film 31A formed on the metal region 21 serves as a mask to prevent a substance that constitutes a target film 35 from adhering to the metal region 21. The target film 35 is thus formed only on the insulator region 22.

The state D illustrates a state after the SAM film removing process S105. At the SAM film removing process S105, the SAM film 31A formed on the metal region 21 is removed, so that the metal of the metal region 21 is exposed on the substrate top face 20.

As described above, according to the present exemplary embodiment, the SAM film 31A is formed on the metal region 21 using the perfluoropolyether group-containing compound that selectively binds to a metal or a semiconductor, whereby the target film 35 can be selectively formed on the insulator region 22 without using a process such as photolithography.

[Function of SAM Film]

Figure 4:
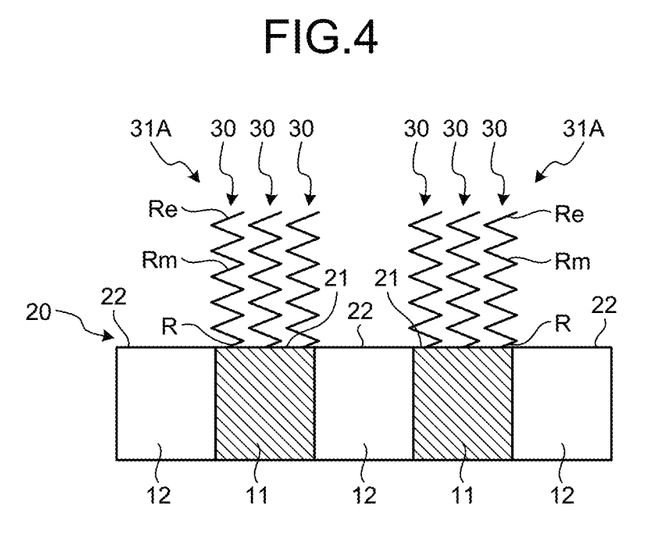
FIG. 4 is a diagram schematically illustrating an exemplary state of a substrate top face after a SAM film is formed on a metal region according to the exemplary embodiments.
Figure 5:
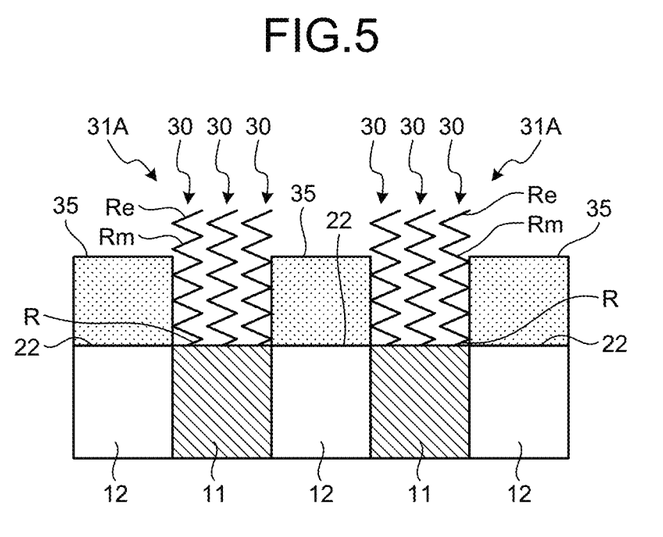
FIG. 5 is a diagram schematically illustrating an exemplary state of the substrate top face after a film is formed on an insulator region according to the exemplary embodiments.

FIG. 4 is a diagram schematically illustrating an exemplary state of the substrate top face 20 after the SAM film 31A is formed on the metal region 21 according to the exemplary embodiments. FIG. 5 is a diagram schematically illustrating an exemplary state of the substrate top face 20 after the film 35 is formed on the insulator region 22 according to the exemplary embodiments.

As illustrated in FIG. 4, a plurality of perfluoropolyether group-containing compounds 30 are arranged closely on the metal region 21 to form the SAM film 31A. Each perfluoropolyether group-containing compound 30 has a binding moiety R, a linker Rm, and a perfluoropolyether moiety Re. The binding moieties R bind to the metal exposed on the surface of the metal region 21. The linkers Rm are arranged closely upright from the surface of the metal region 21. Each perfluoropolyether moiety Re binds to an end of the linker Rm on the opposite side to the binding moiety R and is arranged at a distance by the length of the linker Rm from the substrate top face 20. The distance from the substrate top face 20 to the perfluoropolyether moiety Re varies with the length of the linker Rm. The length of the linker Rm basically increases with increase in number average molecular weight of the perfluoropolyether group-containing compound 30 and increases more by employing a linear structure than by employing a branched structure.

In general, the longer the linker Rm is, the greater the masking effect of the SAM film 31A is (the effect of suppressing formation of the film 35 on the metal region 21). However, if the linker Rm is excessively long (the molecular weight is large), the melting point and the boiling point of the perfluoropolyether group-containing compound 30 become high to increase the possibility that the substrate 1 (the metal pattern 11 and the interlayer dielectric 12) is broken by heat during formation of the SAM film 31A. The number average molecular weight of the perfluoropolyether group-containing compound 30 is set in a range of 1,000 to 30,000 (preferably 1,500 to 30,000, and more preferably 2,000 to 10,000), whereby both of the masking effect and the film formability of the SAM film 31A can be achieved. Specifically, the number average molecular weight is preferably in a range of 2,000 to 10,000. When the number average molecular weight is 2,000 or more, a substantially sufficient masking effect can be achieved. When the number average molecular weight is 10,000 or less, the SAM film 31A can be formed by a vapor deposition process of gasifying the perfluoropolyether group-containing compound 30 and supplying the gas to the substrate top face 20.

Figure 6:
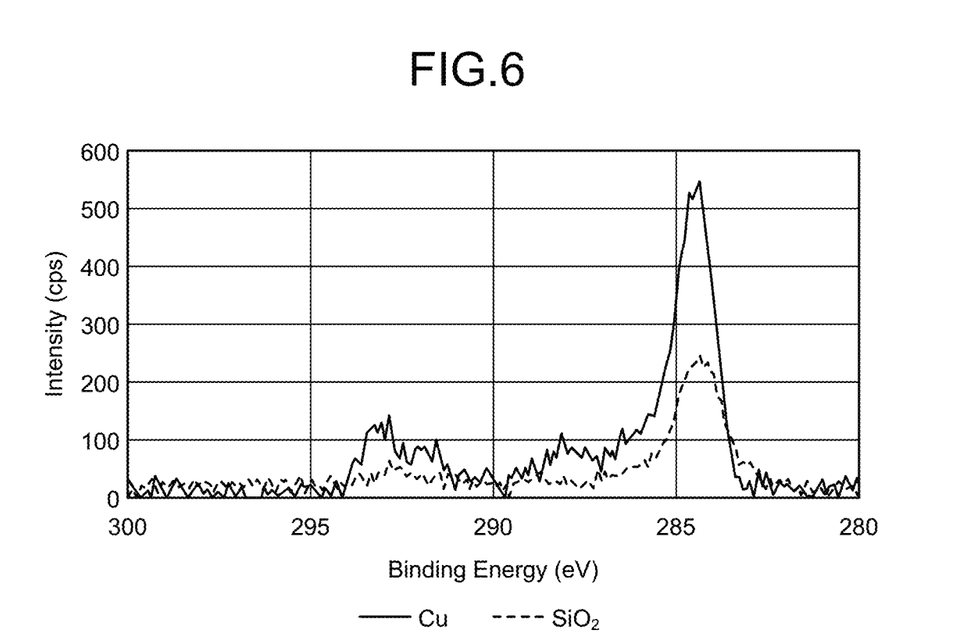
FIG. 6 is a graph illustrating the C 1s orbital spectra of X-ray photoelectron spectroscopy in which samples subjected to a process of forming a SAM film on a Cu surface and on a $SiO_2$ surface were analyzed.

FIG. 6 is a graph illustrating the C 1s orbital spectra in X-ray photoelectron spectroscopy in which samples subjected to a process of forming a SAM film on a Cu surface and on a $SiO_2$ surface were analyzed. The horizontal axis in the graph represents electron orbital energy, and the vertical axis represents the measured electron intensity. In the graph, for the sample subjected to a process of forming the SAM film 31A on Cu, a strong signal indicating the presence of C bonded to fluorine is observed in the vicinity of 293 eV. On the other hand, for the sample subjected to a process forming the SAM film 31A on $SiO_2$, almost no signal indicating the presence of C bonded to fluorine is observed in the vicinity of 293 eV. This result indicates that the SAM film 31A is selectively formed on Cu.

Figure 7:
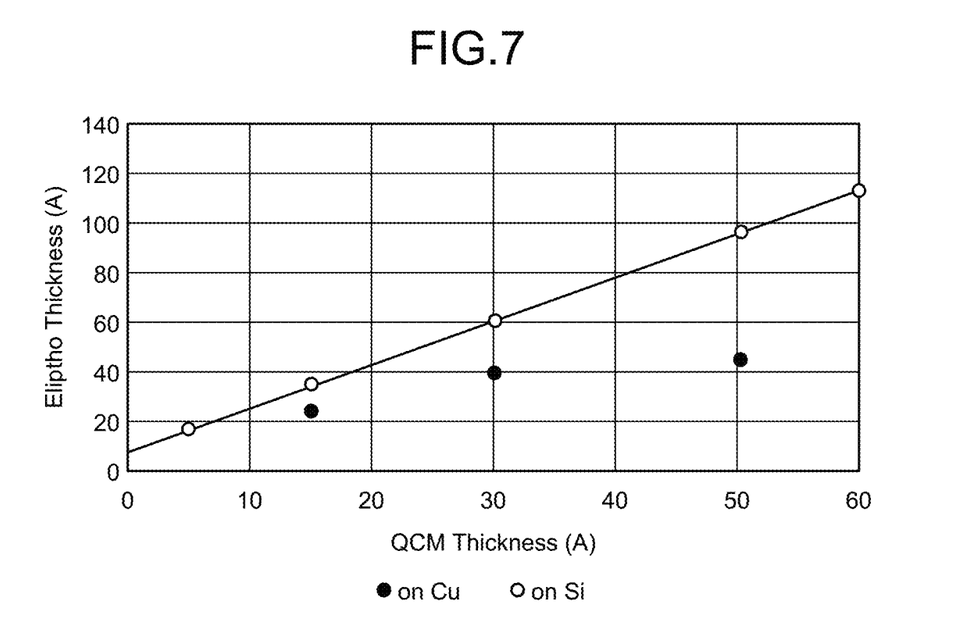
FIG. 7 is a graph illustrating the amount of change in film thickness in samples in which a $SiO_2$ film is deposited on a Si substrate not having a SAM film and on a Cu substrate having a SAM film by vapor deposition.

FIG. 7 is a graph illustrating the amount of change in film thickness in samples in which a $SiO_2$ film is deposited on a Si substrate not having the SAM film 31A and on a Cu substrate having the SAM film 31A by vapor deposition. The horizontal axis in the graph represents the film thickness (the supply amount of $SiO_2$) measured by a quartz oscillator film thickness meter, and the vertical axis represents the film thickness of a $SiO_2$ film actually formed on the sample. The graph demonstrates that, on the Si substrate not having the SAM film 31A, the film thickness of the $SiO_2$ film actually formed increases with increase in supply amount of $SiO_2$, whereas on the Cu substrate having the SAM film 31A, the film thickness of the $SiO_2$ film hardly increases. This result indicates that the $SiO_2$ film is selectively formed on the Si substrate not having the SAM film 31A.

[Method of Producing Perfluoropolyether Group-Containing Compound]

The method of producing the perfluoropolyether group-containing compound according to the present exemplary embodiment is not limited, and the perfluoropolyether group-containing compound can be produced by using known or novel substances and methods as appropriate.

The perfluoropolyether group-containing compound according to the present exemplary embodiment can be produced, for example, using a substance disclosed in Japanese Patent No. 5668888.

[Configuration of Film Forming Apparatus]

Figure 8:
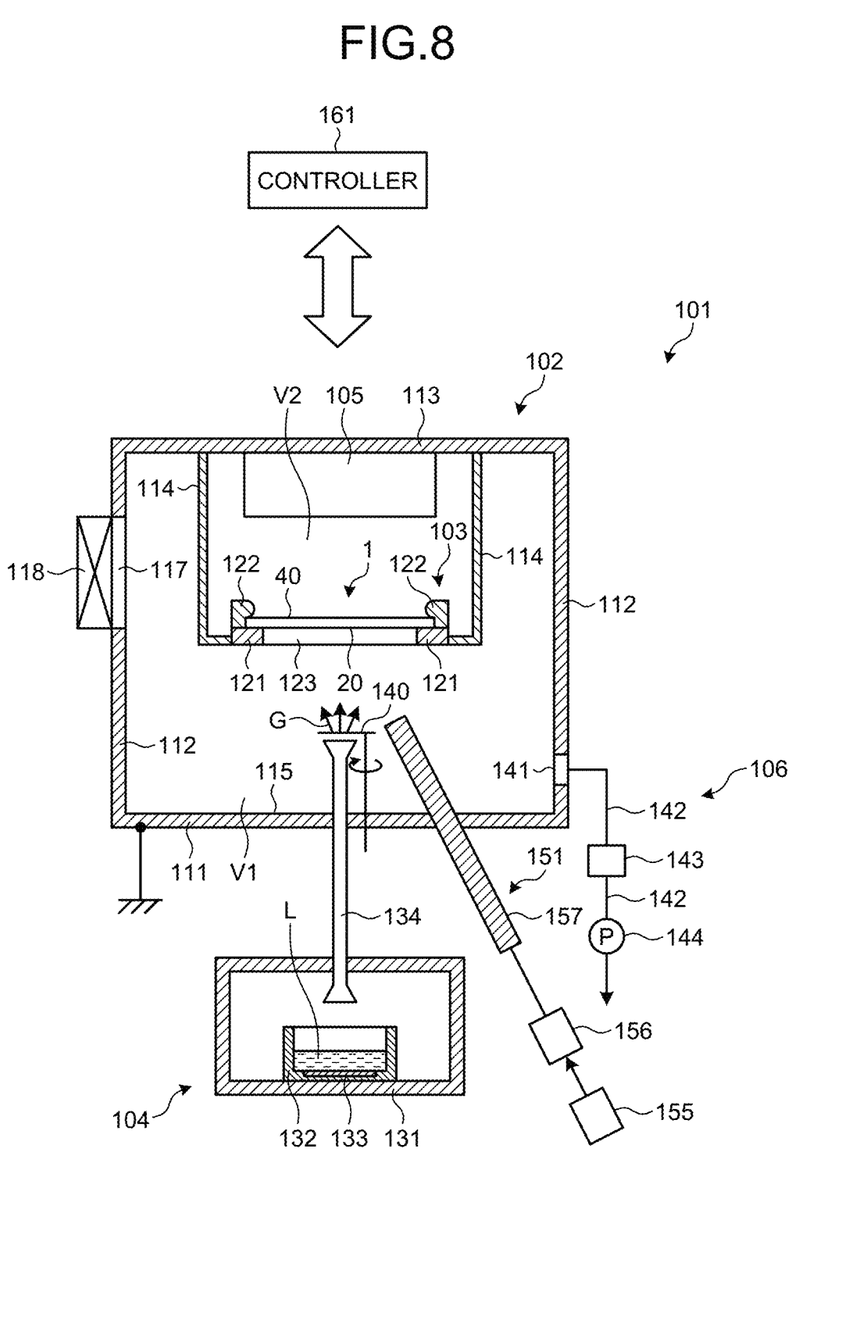
FIG. 8 is a diagram illustrating an exemplary configuration of a film forming apparatus according to the exemplary embodiments.

FIG. 8 is a diagram illustrating an exemplary configuration of a film forming apparatus 101 according to the exemplary embodiments. The film forming apparatus 101 described here includes a unit configured to form the SAM film 31A on the metal region 21 of the substrate top face 20 of the substrate 1 and a unit configured to form the film 35 on the insulator region 22 of the substrate top face 20.

The film forming apparatus 101 includes a chamber 102 accommodating the substrate 1, a substrate holder 103 configured to hold the substrate 1 in the chamber 102, a raw material gas supply unit 104 for supplying a raw material gas G into the chamber 102 to form a film on the substrate top face 20, a substrate heating unit 105 for heating the substrate 1 held by the substrate holder 103, an exhaust unit 106 for exhausting the atmosphere in the chamber 102, and a controller 161 for controlling the entire film forming apparatus 101.

The chamber 102 includes a bottom wall 111, a peripheral wall 112 standing from a peripheral portion of the bottom wall 111, and a top wall 113 sealing a top opening of the peripheral wall 112. The peripheral wall 112 has a carry-in/out port 117 through which the substrate 1 is carried in and out. The carry-in/out port 117 can be opened/closed by an air-tight shutter 118 such as a gate valve.

The exhaust unit 106 includes one or more exhaust ports 141 provided at the peripheral wall 112 of the chamber 102, a pressure regulating valve 143 connected to the exhaust port 141 through an exhaust pipe 142, and a vacuum pump 144 connected to the pressure regulating valve 143 through the exhaust pipe 142. The vacuum pump 144 sucks the atmosphere in the chamber 102 through the exhaust port 141 and the exhaust pipe 142 to evacuate the atmosphere in the chamber 102 and reduce the pressure in the chamber 102.

The substrate holder 103 includes a frame 121 and a chuck 122. The frame 121 has an opening 123 to expose the substrate top face 20 of the substrate 1 toward an inner wall surface 115 of the bottom wall 111 of the chamber 102.

The chamber 102 has a partition wall 114 that divides a space in the chamber 102 into a first space V1 in which the substrate top face 20 is exposed and a second space V2 in which a substrate reverse face 40 is exposed. The partition wall 114 extends from the frame 121 to the top wall 113. The partition wall 114 has a carry-in/out port (not illustrated). The first space V1 and the second space V2 are continuous through the carry-in/out port. The substrate 1 is carried into the substrate holder 103 and the substrate 1 is carried out of the substrate holder 103, through the carry-in/out port. When the substrate 1 is not held by the substrate holder 103, the first space V1 and the second space V2 are continuous through the opening 123 of the frame 121. When the substrate 1 is held by the substrate holder 103, the opening 123 is closed by the substrate 1 held by the substrate holder 103. This configuration prevents formation of a film on the substrate reverse face 40.

The raw material gas supply unit 104 includes a gas generation container 131, a raw material accommodating container 132 provided in the gas generation container 131, and a raw material gas supply pipe 134 in communication with the gas generation container 131 to supply a raw material gas G generated in the gas generation container 131 into the chamber 102.

The raw material accommodating container 132 accommodates a raw material L applicable to the processes S101 to S105 in the film forming method. The raw material L in execution of the SAM forming process S102 is the perfluoropolyether group-containing compound. The raw material L in execution of the film growth process S104 is a compound that constitutes the film 35. When the SAM removing process S105 is performed using the present film forming apparatus 101, the raw material L may be a substance capable of etching the SAM film 31A or a substance capable of etching a metal. When the cleaning process S101 is performed, the raw material L may be a substance capable of removing a metal oxide on the substrate top face 20. When the excess SAM removing process S103 is performed, the raw material L may be a substance capable of etching the SAM film 31A or a substance capable of etching an insulator.

The raw material accommodating container 132 has a heater 133. The heater 133 heats the raw material L to a predetermined temperature to vaporize the raw material L.

The raw material gas G generated by vaporizing the raw material L is transferred to the raw material gas supply pipe 134. A shutter 140 is provided at an end of the raw material gas supply pipe 134 on the chamber 102 side. The shutter 140 is pivotable about one end and can switch between a close state in which the end on the chamber 102 side of the raw material gas supply pipe 134 is closed and an open state in which the end on the chamber 102 side of the raw material gas supply pipe 134 is open. When the end on the chamber 102 side of the raw material gas supply pipe 134 is in the open state, the raw material gas G transferred to the raw material gas supply pipe 134 is supplied into the chamber 102. The raw material gas G is supplied to between the substrate top face 20 of the substrate 1 held by the substrate holder 103 and the inner wall surface 115 of the bottom wall 111 of the chamber 102, that is, to the first space V1.

The raw material gas G is discharged toward the substrate top face 20 from the leading end of the raw material gas supply pipe 134 passing through the bottom wall 111 of the chamber 102 into the chamber 102. That is, the raw material gas G is supplied in a direction from the inner wall surface 115 of the bottom wall 111 of the chamber 102 toward the substrate top face 20.

The substrate heating unit 105 has a heater such as a resistive heating heater and a lamp heater (for example, an LED lamp heater). In the present exemplary embodiment, the substrate heating unit 105 is provided on the substrate reverse face 40 side of the substrate 1 (in the second space V2). The substrate heating unit 105 thus heats the substrate 1 from the substrate reverse face 40.

The film forming apparatus 101 according to the present exemplary embodiment further includes an emission unit 151 that emits an activation gas for activating the raw material gas G supplied from the raw material gas supply unit 104. The emission unit 151 includes a gas source 155 for supplying an activation gas, a mass flow controller 156 for controlling the flow volume of the activation gas, and a gas supply pipe 157 for supplying the activation gas into the chamber 102.

The activation gas supplied from the gas source 155 is supplied to one end of the gas supply pipe 157 through the mass flow controller 156. The mass flow controller 156 controls the flow volume of the activation gas supplied to one end of the gas supply pipe 157. The other end of the gas supply pipe 157 is disposed below the substrate holder 103 in the chamber 102. The gas supply pipe 157 is provided with an ion gun. The activation gas supplied to one end of the gas supply pipe 157 is ionized at a predetermined energy by the ion gun and emitted from the other end of the gas supply pipe 157. The kind of activation gas is not limited, and examples may include rare gases such as argon (Ar).

The operation of the film forming apparatus 101 configured as described above is centrally controlled by the controller 161. The controller 161 is, for example, a computer and controls each unit of the film forming apparatus 101. The operation of the film forming apparatus 101 is centrally controlled by the controller 161.

The controller 161 is, for example, a computer including a central processing unit (CPU), a micro processing unit (MPU), a random access memory (RAM), a read-only memory (ROM), and a storage such as RAM and ROM stores a computer program for controlling a variety of processes performed by the film forming apparatus 101. For example, the storage stores a computer program for executing at least part of the cleaning process S101, the SAM forming process S102, the excess SAM removing process S103, the film growth process S104, and the SAM removing process S105. A main control unit such as CPU and MPU reads and executes a computer program stored in the storage such as RAM and ROM to control the operation of the film forming apparatus 101. The computer program may be recorded on a computer-readable recording medium or may be installed in the storage of the controller 161 from the recording medium. Examples of the computer-readable recording medium include a hard disk (HD), a flexible disk (FD), a compact disc (CD), a magneto-optical disk (MO), and a memory card.

The film forming apparatus 101 having a configuration described above can be used to form the SAM film 31A having a masking effect on the metal region 21 and selectively form the target film 35 on the insulator region 22 without using a process such as photolithography.

The exemplary embodiments disclosed here should be understood as being illustrative rather than being limitative in all respects. The foregoing exemplary embodiments may be omitted, replaced, or modified in various ways without departing from the accompanying claims and the spirit thereof.

The invention claimed is:

1. A film forming method of forming a film on a substrate top face including a first region in which a metal or semiconductor is exposed and a second region in which an insulator is exposed, the film forming method comprising:
   a self-assembled monolayer (SAM) forming process of forming a SAM film of a perfluoropolyether group-containing compound represented by formula (1) or (2) below on the first region; and
   a film growth process of forming a predetermined film on the second region after execution of the SAM forming process, wherein
   the metal or semiconductor is at least one selected from a group consisting of tungsten, ruthenium, germanium, silicon, and molybdenum,
   the insulator is at least one selected from a group consisting of aluminum oxide, hafnium oxide, and zirconia,
   formulae (1) and (2) are as follows:

$$(\text{Rf-PFPE})_\alpha\text{-X-(A)}_\alpha \quad (1)$$

$$(\text{A})_\alpha\text{-X-PFPE-X-(A)}_\alpha \quad (2)$$

in formula (1), Rf is an alkyl group having 1 to 16 carbon atoms optionally substituted with one or more fluorine atoms, and
   in formulae (1) and (2):
   PFPE is $-(\text{OC}_6\text{F}_{12})_a-(\text{OC}_5\text{F}_{10})_b-(\text{OC}_4\text{F}_8)_c-(\text{OC}_3\text{F}_6)_d-(\text{OC}_2\text{F}_4)_e-(\text{OCF}_2)_f-$, where a, b, c, d, e, and f are integers of 0 or more and 200 or less, and the sum of a, b, c, d, e, and f is at least 1, A is —COOH, X is a single bond or a di- to deca-valent organic group, and $\alpha$ is an integer of 1 to 9, and $\alpha'$ is an integer of 1 to 9.

2. The film forming method according to claim 1, wherein the perfluoropolyether group-containing compound has a number average molecular weight of 10,000 or less, and the SAM film is formed by vapor deposition.

3. The film forming method according to claim 1, wherein the perfluoropolyether group-containing compound has a number average molecular weight of 2,000 to 10,000.

4. The film forming method according to claim 1, further comprising, before execution of the film growth process, an excess SAM removing process of removing the SAM film formed on the second region.

5. The film forming method according to claim 1, further comprising, before execution of the SAM forming process, a cleaning process of cleaning the substrate top face.

6. The film forming method according to claim 1, further comprising, after execution of the film growth process, a SAM removing process of removing the SAM film formed on the first region.

7. A film forming apparatus configured to form a film on a substrate top face including a first region in which a metal or semiconductor is exposed and a second region in which an insulator is exposed, the film forming apparatus comprising:

a unit configured to form a self-assembled monolayer (SAM) film of a perfluoropolyether group-containing compound represented by formula (1) or (2) below on the first region; and a unit configured to form a predetermined film on the second region after the SAM film is formed, wherein the metal or semiconductor is at least one selected from the group consisting of tungsten, ruthenium, germanium, silicon, and molybdenum, the insulator is at least one selected from the group consisting of aluminum oxide, hafnium oxide, and zirconia, formulae (1) and (2) are as follows:

$$(Rf\text{-}PFPE)_{\alpha'}\text{-}X\text{-}(A)_\alpha \qquad (1)$$

$$(A)_\alpha\text{-}X\text{-}PFPE\text{-}X\text{-}(A)_\alpha \qquad (2)$$

in formula (1), Rf is an alkyl group having 1 to 16 carbon atoms optionally substituted with one or more fluorine atoms, and in formulae (1) and (2):

PFPE is —$(OC_6F_{12})_a$—$(OC_5F_{10})_b$—$(OC_4F_8)_c$—$(OC_3F_6)_d$—$(OC_2F_4)_e$—$(OCF_2)_f$—, where a, b, c, d, e, and f are integers of 0 or more and 200 or less, and the sum of a, b, c, d, e, and f is at least 1, A is —COOH, X is a single bond or a di- to deca-valent organic group, and $\alpha$ is an integer of 1 to 9, and $\alpha'$ is an integer of 1 to 9.

* * * * *